United States Patent
Olson

(10) Patent No.: US 9,960,098 B2
(45) Date of Patent: May 1, 2018

(54) SYSTEMS AND METHODS FOR THERMAL CONDUCTION USING S-CONTACTS

(71) Applicant: pSemi Corporation, San Diego, CA (US)

(72) Inventor: Chris Olson, Palatine, IL (US)

(73) Assignee: pSemi Corporation, San Diego, CA (US)

( * ) Notice: Subject to any disclaimer, the term of this patent is extended or adjusted under 35 U.S.C. 154(b) by 0 days. days.

(21) Appl. No.: 15/194,114

(22) Filed: Jun. 27, 2016

(65) Prior Publication Data

US 2017/0372984 A1     Dec. 28, 2017

(51) Int. Cl.
| | |
|---|---|
| *H01L 23/373* | (2006.01) |
| *H01L 27/12* | (2006.01) |
| *H01L 21/84* | (2006.01) |
| *H01L 21/48* | (2006.01) |

(52) U.S. Cl.
CPC ...... *H01L 23/3735* (2013.01); *H01L 21/4882* (2013.01); *H01L 21/84* (2013.01); *H01L 27/1203* (2013.01)

(58) Field of Classification Search
CPC .......................... H01L 23/3735; H01L 21/4882
See application file for complete search history.

(56) References Cited

U.S. PATENT DOCUMENTS

| | | | | |
|---|---|---|---|---|
| 2010/0127296 | A1* | 5/2010 | Hioki | H01L 25/167 257/98 |
| 2011/0001148 | A1* | 1/2011 | Sun | H01L 33/60 257/88 |
| 2013/0088870 | A1* | 4/2013 | Hsu | H05K 1/0206 362/249.01 |
| 2013/0135824 | A1* | 5/2013 | Harubeppu | H01L 23/34 361/709 |
| 2015/0008570 | A1* | 1/2015 | Arai | H01L 23/49811 257/687 |
| 2015/0255370 | A1* | 9/2015 | Shiota | H01L 23/36 257/77 |
| 2015/0319840 | A1* | 11/2015 | Sanada | H01L 23/13 361/709 |

* cited by examiner

*Primary Examiner* — Dung Le
(74) *Attorney, Agent, or Firm* — Jaquez Land Greenhaus LLP; Martin J. Jaquez, Esq.; Bruce W. Greenhaus, Esq.

(57) ABSTRACT

An integrated circuit architecture that provides a path having relatively low thermal resistance between one or more electronic devices and one or more thermal structures formed on an insulator layer on a substrate. Independent parallel thermal conduction paths are provided through the insulator layer, such as a buried oxide ("BOX") layer, to allow heat to flow from the substrate layer to a thermal structure disposed upon the BOX layer. In some cases, the substrate is a silicon substrate layer supporting the thermal structure and a heat source, such as an electronic device (e.g., power amplifier, transistor, diode, resistor, etc.).

12 Claims, 6 Drawing Sheets

| Layer Name | Total μm Thickness | Material | conductivity W/(m-K) |
|---|---|---|---|
| SolderCap | 20 | SnAg | 67 (Sn) |
| Main Pillar | 50 | Cu | 401 |
| AM | 4 | Al | 237 |
| FT | 4.1 | W | 174 |
| MT | 0.48 | Al | 237 |
| V1 | 0.4 | W | 174 |
| M1 | 0.33 | Cu | 401 |
| CA | 0.51 | W | 174 |
| RX | 0.145 | Epi Si | 148 |
| BOX | 1/0.05 | SiO2 | 1.38 |
| Substrate | 200 | Al2O3/Si | 42/148 |

Table 1

SYSTEMS AND METHODS FOR THERMAL CONDUCTION USING S-CONTACTS

BACKGROUND

(1) Technical Field

Various embodiments described herein relate to fabrication of semiconductors. In particular, some embodiments relate to systems and methods for efficiently conducting heat away from a heat source disposed on a poor thermal conducting layer.

(2) Background

Dissipating heat can be important for protecting electronic devices and achieving higher levels of performance in such devices. In particular, electronic devices, such as diodes, transistors, resistors, etc., that are manufactured on an insulating layer over a semiconductor substrate can overheat if heat is not dissipated efficiently. One example is silicon on insulator (SOI) devices made on a silicon substrate. For such devices, a thermal conduction path can be provided that enables heat to flow away from an electronic device. In general, the heat flows to a thermal structure placed close by on the semiconductor substrate. Such a thermal structure can conduct heat away from the device and toward a heat sink (for example, an ideal thermal ground). The heat can flow through the substrate to the heat sink, if the heat sink is either wirebonded to the substrate or attached in a similar manner, such that the substrate is thermally attached to the heat sink. This "thermal management problem" becomes more difficult to resolve when the integrated circuit chip ("IC") is mounted in a "flip chip" manner. In such cases, the heat must flow from the source through a variety of paths (primarily the substrate) to a solder bump or copper pillar that is off the IC and then flow into the heat sink. Such thermal structures include structures commonly referred to as "thermal bumps" or "thermal pillars".

However, the electrically insulating layer that is formed between an electronic device and a silicon substrate layer is typically also a thermally insulating layer (i.e., a poor thermal conductor). In some cases, the insulating layer is a buried oxide (BOX) layer. Accordingly, because the thermal conduction path between the device and the thermal structure typically traverses the BOX layer, the thermal resistance over the conduction path is higher than is desirable, reducing the efficiency of the conduction path in removing heat from the heat source.

One way in which this problem has been addressed is to electrically connect the device to metallic wires that are large enough to also provide a thermal conduction path. Thus, heat is conducted directly from the device through the electrical contacts to a thermal heat sink, such as a thermal ground. In some such cases, the same structure that provides an electrical ground for the device can serve as a thermal ground as well. However, this approach requires the electrical contacts to be relatively large and may not be ideal in all cases.

Alternatively, in some cases, a substrate contact ("S-contact") is provided that provides an electrical from the electronic device through the insulating layer (e.g., the BOX layer) to the substrate. Such an electrical contact will typically have negligible effect with regard to the reduction in the thermal resistance from the silicon substrate through the BOX layer to the thermal structure.

Therefore, there is a currently a need for a structure that provides a path having relatively low thermal resistance between an electronic device and a thermal structure, particularly by improving the thermal conduction through the BOX layer.

SUMMARY OF THE INVENTION

The invention encompasses an integrated circuit (IC) architecture that provides a path having relatively low thermal resistance between one or more electronic devices and one or more thermal structures formed on an insulator layer on a substrate. A high density of independent parallel thermal conduction paths is provided through the insulator layer, such as a buried oxide ("BOX") layer, to allow heat to flow from the electronic devices through the substrate to one or more associated thermal structures. In some cases, the substrate is a silicon substrate supporting the thermal structure and a heat source, such as an electronic device. In some cases, the electronic device is a power amplifier. Alternatively, the heat source can be a field effect transistor (FET), a diode, a resistor, or any other component or combination of components in which power is dissipated and/or in which heat is generated.

In some cases, the thermal structure includes several layers of material topped with a "thermal bump" or "thermal pillar" and solder cap. Multiple thermal conduction paths through the substrate to the thermal structure are provided by a substrate contact ("S-contact") that has a low thermal impedance. S-contacts may be provided up to the maximum density allowed by the design rules that dictate the manner in which structures can be formed at each layer of the IC.

In one case, each thermal pillar is formed as a structure having several layers. The S-contacts are formed between the thermal pillar and the substrate and provide a thermal conduction path through the intervening BOX layer. In at least one case, in excess of about 1,000 S-contacts are disposed under a single thermal pillar, and in at least one other case, in excess of about 6,000 S-contacts are disposed under a single thermal pillar. In one case, each of the S-contacts are evenly spaced over the area underlying the thermal pillar. In at least one such case, there are areas under the thermal pillar that are devoid of S-contacts. These areas are provided to ensure adherence to the design rules that dictate the fabrication of the structure.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The invention encompasses an integrated circuit (IC) architecture that provides a path having relatively low thermal resistance between one or more electronic devices and one or more thermal structures formed on an insulator layer on a substrate. A high density of independent parallel thermal conduction paths (i.e., substrate contacts or "S-contacts") is provided through the insulator layer, such as a buried oxide layer, to allow heat to flow from the electronic devices through the substrate to one or more associated thermal structures. In some cases, the substrate is a silicon substrate supporting the thermal structure and a heat source, such as an electronic device.

Figure 1:
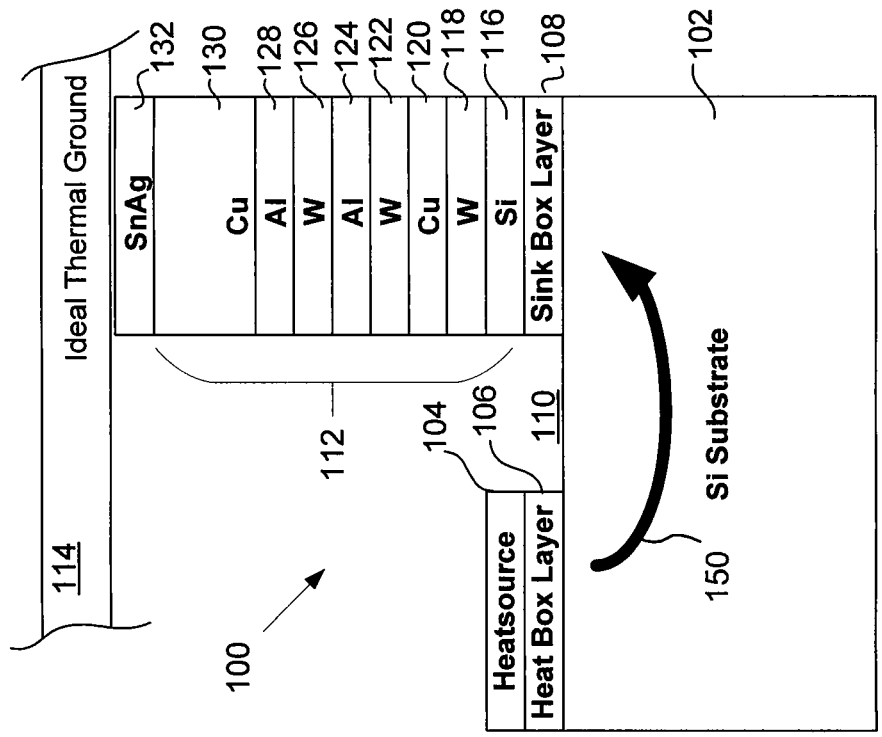
FIG. 1 is a simplified cross-sectional illustration of an example semiconductor device.

In order to better understand the context in which embodiments of the invention are useful, it may be useful to consider an example of an IC structure that may exhibit thermal problems. FIG. 1 is a simplified cross-sectional illustration of an example semiconductor device 100. FIG. 1 also includes a table (Table 1) that indicates some of the characteristics of the example semiconductor device 100.

The semiconductor device 100 includes a substrate 102. The substrate 102 provides an electrical and structural base upon which a heat source 104 is built. In some cases, the heat source 104 is an amplifier or other active semiconductor component that generates heat during operation, but may be any electronic device that generates unwanted heat. Since the particular architecture of the heat source 104 is not related to the concepts disclosed herein, no additional details regarding the heat source 104 are provided. However, those of ordinary skill in the art will understand the structure of such heat sources.

As noted in Table 1, in the illustrated example, the substrate 102 is $Al_2O_3$. Alternatively, the substrate 102 may be silicon. In the illustrated example, the $Al_2O_3$ is 200 um thick and has a thermal conductivity of approximately 42 Watt per meter Kelvin (W/m-K). If the substrate is composed of silicon of the same thickness, the substrate 102 will typically have a thermal conductivity of 148 K W/m-K, as shown in Table 1. It should be noted that any material (of any thickness and thermal conductivity) can be used to fabricate the substrate 102, assuming that the resulting substrate has properties desired for fabricating the heat source 104.

The heat source 104 is mounted on an insulator layer 106 that resides between the heat source 104 and the substrate 102. In one case, the insulator layer 106 is a buried silicon oxide ($SiO_2$) layer (commonly referred to as a "BOX layer"). For the purposes of this discussion, the insulator layer 106 is referred to as a "heat BOX layer". It will be understood that the heat BOX layer 106 may be fabricated from any material that provides properties desired for fabrication of the heat source 104. One of the properties of the insulator layer 106 is that it electrically insulates the heat source 104 from the substrate 102.

In the illustrated example, spaced apart from the heat source 104 and the heat BOX layer 106 is a second section of insulator material 108. In some cases, the second section of insulator material 108 is fabricated from the same material as the heat BOX layer 106 (e.g., $SiO_2$). The second section is referred to herein as the "sink BOX layer" 108. In some such cases, the two sections of insulator material 106, 108 are formed at the same time (i.e., as one "layer"), but may be formed at separate times and with different materials. In some cases, the heat BOX layer 106 and the sink BOX layer 108 are no greater than about 1 um thick; in other cases, the heat BOX layer 106 and the sink BOX layer 108 are no greater than about 0.05 um thick. However, those skilled in the art will recognize that in other cases, the BOX layers 106, 108 may be of thicknesses that are greater those noted above. In the illustrated example, the thermal conductivity of each BOX layer 106, 108 is 1.38 W/m-K. In some embodiments, a void 110 may be etched out between the heat BOX layer 106 and the sink BOX layer 108 to separate the two sections of BOX material.

A thermal structure 112 is fabricated on top of the sink BOX layer 108. In one case, the thermal structure includes either a "thermal bump" or alternatively, a "thermal pillar" having a solder cap over the pillar. In some cases, the thermal structure further includes several layers that are compatible with the overall manufacturing process for the IC. For example, in one case, the thermal structure 112 is includes from multiple thermally conductive layers. In the illustrated example, a nine-layer thermal structure 112 is formed on top of the sink BOX layer 108 as follows: a first layer 116 of silicon epitaxy (commonly referred to as "epi-silicon" or simply "epi"); a second layer 118 of tungsten (W); a third layer 120 of copper (Cu); a fourth layer 122 of tungsten (W); a fifth layer 124 of aluminum (Al); a sixth layer 126 of tungsten (W); a seventh layer 128 of aluminum (Al); and a thick eighth layer or main pillar 130 of copper (Cu). The first seven layers are formed as part of the fabrication of a larger structure that includes the structures that are shown in FIG. 1 and other structures that are not shown in FIG. 1. For example, the fifth layer 124 may be used to form conductors (i.e., wired connections) between other components that are formed on the substrate 102 at other parts of the integrated circuit not shown in FIG. 1. In one such embodiment, at other locations on the larger integrated circuit, the tungsten layers, such as the second layer 118, the fourth layer 122 and the sixth layer 126, are used to form electrical connections (i.e., "vias") between the different silicon, copper and aluminum layers 116, 120, 124, 128. The tungsten is typically etched away from any areas where it is not used either in the thermal structure 112 or as a via between the other conductive layers 116, 120, 124, 128. As shown in FIG. 1, the second layer 118 through the seventh layer 128 have been removed (e.g., etched or otherwise) from everywhere but over the sink BOX layer 108. The array of S-contacts provide an improved heat flow path through the BOX layer.

A solder cap 132 (such as a silver/tin alloy) may be formed over the top of the main pillar 130 for thermally and electrically connecting the thermal structure 112 to an ideal thermal ground 114. The various layers of the example thermal structure 112 have the associated layer name, approximate thickness, and approximate thermal conductivity shown in Table 1. It should be appreciated that the thermal structure 112 is only an example, and that other configurations and materials for the thermal structure 112 are within the scope of the invention.

As noted above, the heat source 104 generates excess heat that may need to be dissipated. The thermal structure 112 provides one leg of a thermal conduction path for heat generated by the heat source to flow to the ideal thermal ground 114. The other legs of the thermal conduction path are formed by the heat BOX layer 106, the substrate 102, and the sink BOX layer 108. Arrow 150 indicates the flow of heat from the heat source 104 through the heat BOX layer 106, the substrate 102, and the sink BOX layer 108 to the thermal structure 112, and thus ultimately to the "ideal thermal ground" 114.

Figure 2:
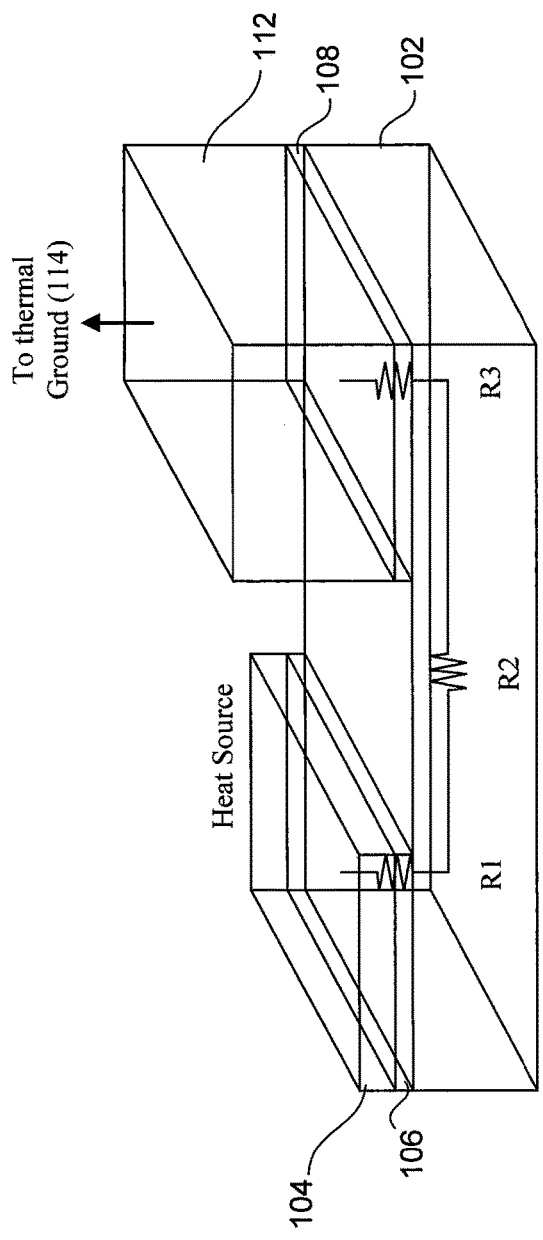
FIG. 2 is a simplified perspective view of the components within a thermal conduction path from a heat source to an ideal thermal ground.
Figure 3:
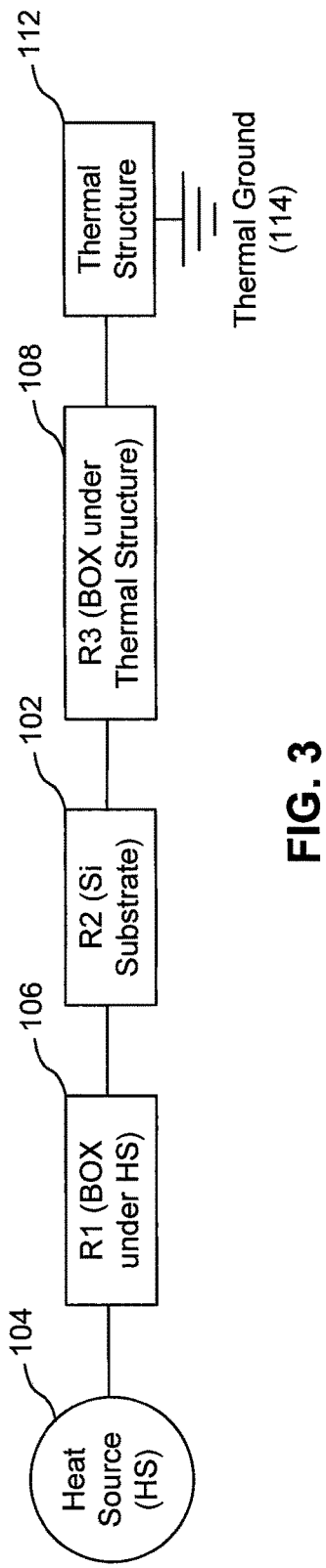
FIG. 3 is a block diagram representing the thermal conduction path from a heat source to an ideal thermal ground.

FIG. 2 is a simplified perspective view of the components within a thermal conduction path from a heat source 104 to an ideal thermal ground 114. FIG. 3 is a block diagram representing the thermal conduction path from a heat source 104 to an ideal thermal ground 114. The thermal resistance of the heat BOX layer 106 is designated as R1, the thermal resistance of the substrate 102 is designated as R2, and the thermal resistance of the sink BOX layer 108 is designated as R3. Because the material used in fabricating the heat BOX layer 106 and the sink BOX layer 108 are selected to be electrical insulators, those layers typically are not good heat conductors. More particularly, comparing the values of Table 1, it can be seen that the thermal conductivity of the BOX layers 106, 108 is one to two orders of magnitude less than the thermal conductivity of the substrate 102 and generally more than two orders of magnitude less than the thermal conductivity of the layers of the thermal structure 112. Accordingly, the sum $R_{tot}$ of these three thermal resistances (R1+R2+R3) is typically substantial, especially R1 and R3.

To reduce the total resistance $R_{tot}$, in various embodiments of the invention a high density of thermally conductive S-contacts is formed through the sink BOX layer 108 to essentially bypass the thermal resistance R3 of the sink BOX layer 108. Doing so provides a set of parallel heat conduction paths which lower the total thermal resistance to the flow of heat from the heat source 104 to the thermal structure 112.

Figure 4:
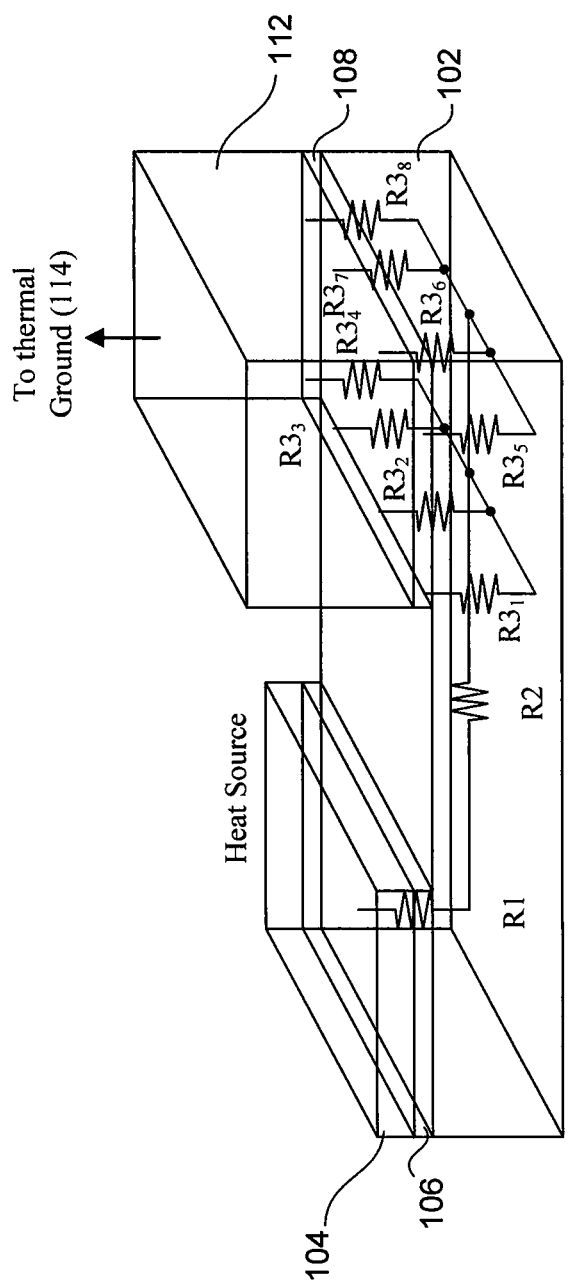
FIG. 4 is a simplified perspective view of the components within a thermal conduction path from a heat source to an ideal thermal ground through a plurality of thermally conductive S-contacts.
Figure 5:
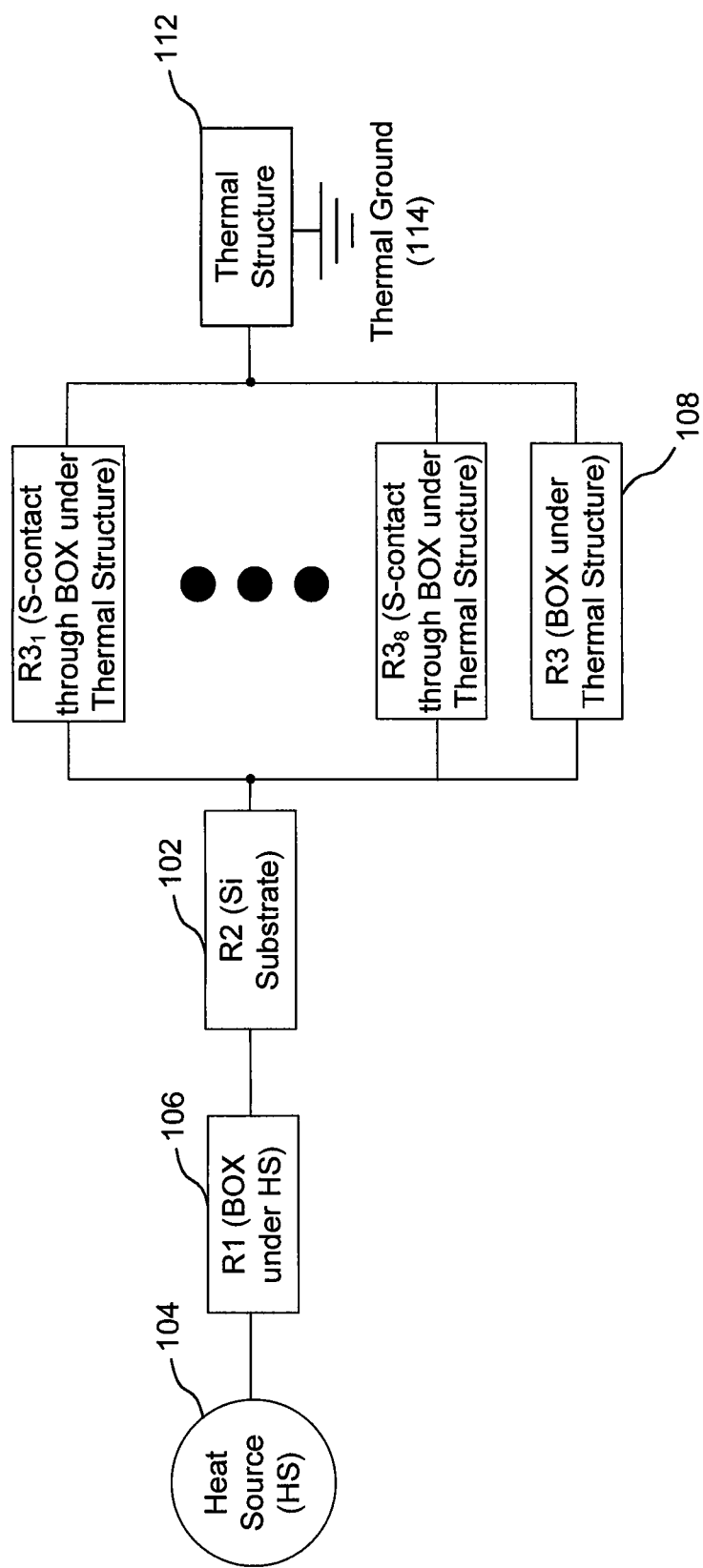
FIG. 5 is a block diagram representing the thermal conduction path from a heat source to an ideal thermal ground through a plurality of thermally conductive S-contacts.

FIG. 4 is a simplified perspective view of the components within a thermal conduction path from a heat source to an ideal thermal ground through a plurality of thermally conductive S-contacts. FIG. 5 is a block diagram representing the thermal conduction path from a heat source to an ideal thermal ground through a plurality of thermally conductive S-contacts. In both figures, 8 S-contacts $R3_1$ through $R3_8$ are shown by way of example. By placing each of the 8 S-contacts in series between the substrate 102 and the sink BOX layer 108, the total thermal resistance is reduced. Thus, $R_{tot}$=R1+R2+R3', where R3'=[1/((1/R3$_1$)+(1/R3$_2$)+(1/R3$_3$)+(1/R3$_4$)+(1/R3$_5$)+(1/R3$_6$)+(1/R3$_7$)+(1/R3$_8$)+(1/R3))]. Preferably, each of the values for $R3_i$ are less than the value of R3, the thermal resistance through the sink BOX layer 108. That is, the thermal resistance $R3_i$ through any one S-conductor "i" preferably is less than the thermal resistance R3 through the sink BOX layer 108. The sum of the parallel thermal resistances of the S-contacts is therefore far less than the thermal resistance R3 through the sink BOX layer 108 alone.

In the illustrated example, 8 S-contacts are shown only for ease of illustration. In many cases, the number of S-contacts will be much larger. For example, in some cases, the number of S-contacts is 50, 100, 500, 1000, 5000 or more. The size and number (and hence density) of the S-contacts are process dependent, but preferably the S-contacts are provided in large numbers up to the maximum density allowed by the design rules that dictate the manner in which such structures can be formed in a particular IC fabrication process. Thus, in the general case of n S-contacts, the total thermal resistance $R_{tot}$ is:

$$Rtot = R1 + R2 + \left[ 1 \Big/ \left( \left( \frac{1}{R3} \right) + \sum_{k=1}^{n} \left( \frac{1}{R3k} \right) \right) \right] \quad \text{Equation 1}$$

Figure 6:
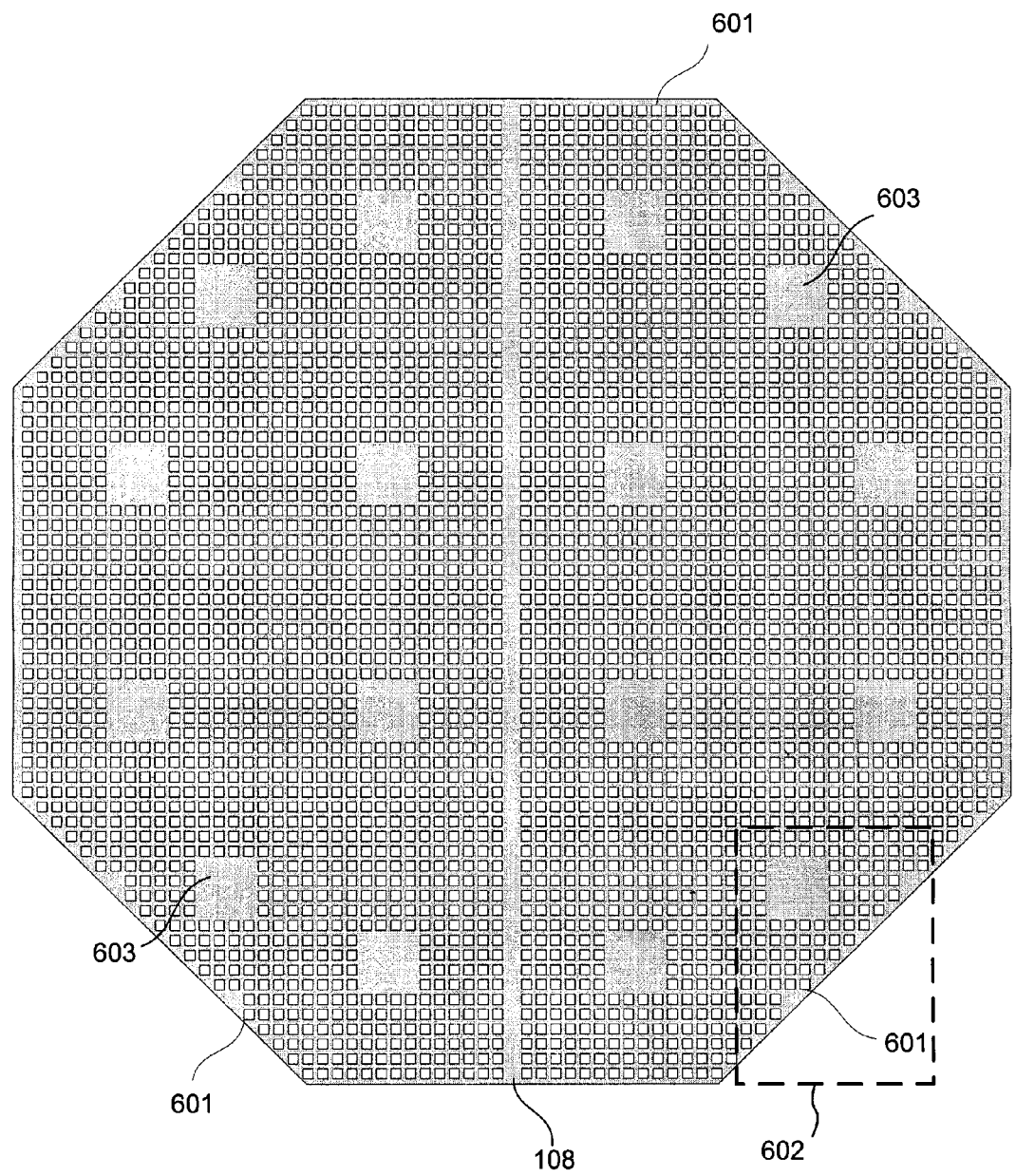
FIG. 6 is a top view of a large number of S-contacts formed through a sink BOX layer.

FIG. 6 is a top view of a large number of S-contacts 601 formed through a sink BOX layer 108 (only 3 S-contacts 601 are referenced to avoid clutter). In this particular example, 6,244 S-contacts 601 define a polygon sized to essentially match the "footprint" of the bottommost layer of a thermal structure 112 and provide a thermal connection between a substrate 102 and the thermal structure 112 though the sink BOX layer 108. A portion of the sink BOX layer 108 surrounds each of the individual S-contacts 601. In addition, there are a number of "void areas" 603 distributed around the sink Box layer 108 in which there are no S-contacts 601. For the particular fabrication process used to make an example IC, the void areas 603 ensure adherence to the design rules that dictate how much of the sink BOX layer 108 can be taken up with S-contacts 601.

While the pattern of S-contacts 601 shown in FIG. 6 is octagonal to match the shape of a particular thermal structure 112, other shapes for the thermal structure 112 are possible, and thus the pattern of S-contacts 601 may vary. In addition, in some cases, the shape of the thermal structure 112 and the shape defined by the distribution of S-contacts 601 within the sink BOX layer 108 need not be the same. Also, the shape of the sink BOX layer 108 need not match either the shape of the base of the thermal structure 112 or the shape defined by the distribution of S-contacts 601. While putting the S-contacts directly under the thermal bump results in the shortest thermal path, the S-contacts could be offset. In this case, the metal connection between the S-contacts and the thermal bump would conduct heat between these points, although with increased thermal resistance. Nonetheless, in at least some cases, the S-contacts 601 generally underlie the entire thermal structure 112, such that each of the S-contacts 601 makes contact with both the base layer (e.g., silicon epitaxy layer 116) of the thermal structure 112 at a first end and with the substrate 102 at a second end. Further, it is desirable that the S-contacts 601 have a density such that at least approximately 15% of the base area of thermal structure 112 is thermally coupled through to the substrate 102, and/or that the total thermal resistance $R_{tot}$ when using S-contacts 601 is within 150% of R1+R2 (i.e., as the bracketed component, R3', of $R_{tot}$ in Equation 1 approaches zero), and/or that the bracketed component, R3', of $R_{tot}$ in Equation 1 is less than about 26.1 Watts per meter Kelvin.

Figure 7A:
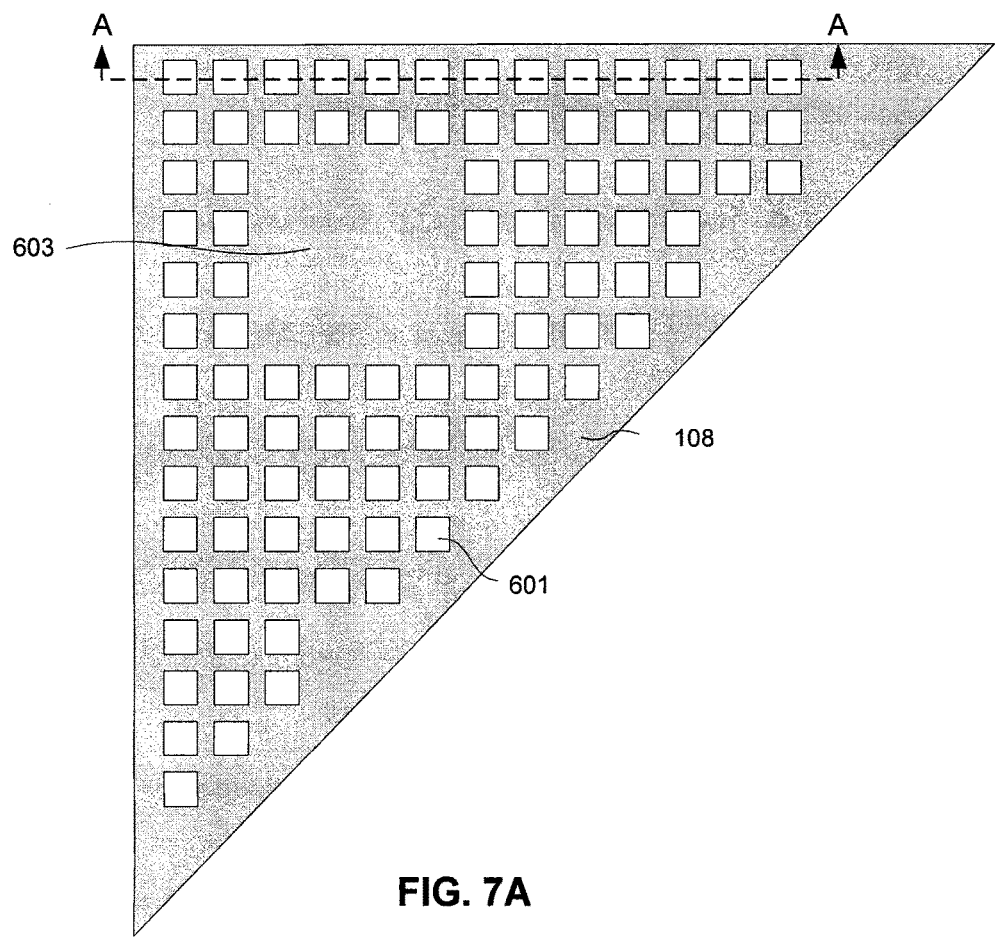
FIG. 7A is a magnified view of some of the S-contacts shown in FIG. 6.
Figure 7B:
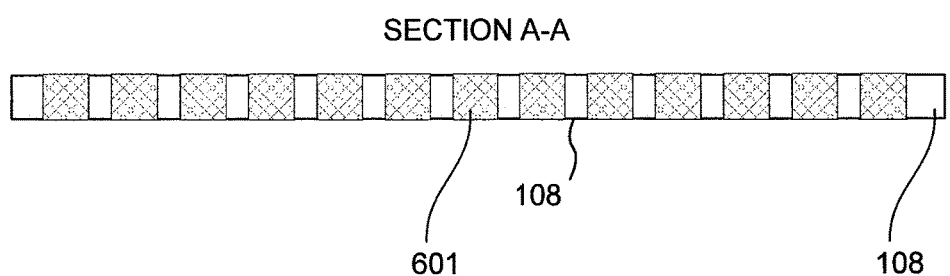
FIG. 7B is a cross-sectional view along the line A-A shown in FIG. 7A.

FIG. 7A is a magnified view of some of the S-contacts 601 shown in FIG. 6 (i.e., those bounded by dashed box 602). Each of the S-contacts 601 is spaced apart from the adjacent S-contacts 601. FIG. 7B is a cross-sectional view along the line A-A shown in FIG. 7A. Each of the S-contacts 601 penetrate through the sink BOX layer 108 in parallel to each of the other S-contacts 601. In some cases, the S-contacts 601 are made of tungsten. However, they can be made of other materials, such as polysilicon, copper, aluminum or other such thermally conductive materials. In addition, in one embodiment, they are made from layers of such materials. It should be noted that the S-contacts 601 need not be of the particular shape shown. Rather, they can be of any shape that provides an efficient grouping of the S-contacts. For example, the S-contacts 601 may be circular or polygonal in cross-section.

Methods

Another aspect of the invention includes a method for forming a semiconductor structure, including: providing a substrate; forming an insulator layer on the substrate; forming a thermal structure on the insulator layer; and forming a plurality of S-contacts penetrating the insulator layer to thermally connect the substrate with the thermal structure and spaced over an area that underlies the thermal structure.

Other aspects of the above method include: forming at least one heat source upon the insulator layer, each heat source being spaced apart from the thermal structure; the thermal structure comprising a plurality of thermally conductive layers; at least some of the layers of the thermal structure comprising silicon, aluminum, tungsten, and/or copper; the plurality of S-contacts comprising at least 100 such S-contacts; the plurality of S-contacts comprising at least 500 such S-contacts; the plurality of S-contacts comprising at least 1000 such S-contacts; the plurality of S-contacts comprising at least 5000 such S-contacts; the plurality of S-contacts being independent parallel thermal conduction paths between the substrate and the thermal structure; the plurality of S-contacts having a density such that approximately 15% of the area that underlies the thermal structure is thermally coupled through to the substrate; and the plurality of S-contacts having a density such that the thermal resistance between the thermal structure and the substrate is less than about 26.1 Watts per meter Kelvin.

Fabrication Technologies and Options

As should be readily apparent to one of ordinary skill in the art, various embodiments of the claimed invention can be implemented to meet a wide variety of specifications. Unless otherwise noted above, selection of suitable component values is a matter of design choice and various embodiments of the claimed invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts claimed are particularly useful with an SOI-based fabrication process (including SOS), and with fabrication processes having similar characteristics.

A number of embodiments of the claimed invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the claimed invention, which is defined by the scope of the following claims, and that other embodiments are within the scope of the claims.

What is claimed is:

1. A semiconductor integrated circuit comprising:
   (a) a heat source fabricated within the semiconductor integrated circuit;
   (b) a semiconductor substrate fabricated within the semiconductor integrated circuit providing an electrical base upon which the heat source is fabricated;
   (c) an insulator layer within the semiconductor integrated circuit disposed on the semiconductor substrate;
   (d) a thermal structure within the semiconductor integrated circuit disposed on the insulator layer; and
   (e) a plurality of substrate contacts ("S-contacts") penetrating the insulator layer to provide a thermal conduction path from the substrate to the thermal structure and spaced over an area that underlies the thermal structure to provide a thermal conduction path.

2. Claim 1, wherein at least some of the S-contacts are not directly under the thermal structure.

3. The semiconductor structure of claim 1, further comprising at least one heat source upon the insulator layer, each heat source being spaced apart from the thermal structure.

4. The semiconductor structure of claim 1, wherein the thermal structure comprises a plurality of thermally conductive layers.

5. The semiconductor structure of claim 4, wherein at least some of the layers of the thermal structure comprise silicon, aluminum, tungsten, and/or copper.

6. The semiconductor structure of claim 1, wherein the plurality of S-contacts comprises at least 100 such S-contacts.

7. The semiconductor structure of claim 1, wherein the plurality of S-contacts comprises at least 500 such S-contacts.

8. The semiconductor structure of claim 1, wherein the plurality of S-contacts comprises at least 1000 such S-contacts.

9. The semiconductor structure of claim 1, wherein the plurality of S-contacts comprises at least 5000 such S-contacts.

10. The semiconductor structure of claim 1, wherein the plurality of S-contacts are independent parallel thermal conduction paths between the substrate and the thermal structure.

11. The semiconductor structure of claim 1, wherein the plurality of S-contacts has a density such that at least approximately 15% of the area that underlies the thermal structure is thermally coupled through to the substrate.

12. The semiconductor structure of claim 1, wherein the plurality of S-contacts has a density such that a thermal resistance between the thermal structure and the substrate is less than about 26.1 Watts per meter Kelvin.

* * * * *